(12) United States Patent
Rafferty

(10) Patent No.: US 7,633,069 B2
(45) Date of Patent: Dec. 15, 2009

(54) DUAL-MODE ELECTRON BEAM COLUMN

(75) Inventor: Brian Rafferty, Bury St. Edmunds (GB)

(73) Assignee: Vistec Lithography Limited, Cambridgeshire (GB)

( * ) Notice: Subject to any disclaimer, the term of this patent is extended or adjusted under 35 U.S.C. 154(b) by 371 days.

(21) Appl. No.: 11/793,422

(22) PCT Filed: Nov. 17, 2005

(86) PCT No.: PCT/EP2005/056030

§ 371 (c)(1), (2), (4) Date: Jun. 20, 2007

(87) PCT Pub. No.: WO2006/067004

PCT Pub. Date: Jun. 29, 2006

(65) Prior Publication Data

US 2008/0093561 A1    Apr. 24, 2008

(30) Foreign Application Priority Data

Dec. 21, 2004   (GB) ................................. 0427961.8

(51) Int. Cl.
H01J 1/50 (2006.01)
(52) U.S. Cl. ............................. 250/396 ML; 250/396 R
(58) Field of Classification Search ...... 250/396 R–396 ML
See application file for complete search history.

(56) References Cited

U.S. PATENT DOCUMENTS

| | | | | |
|---|---|---|---|---|
| 4,263,514 A | * | 4/1981 | Reeds, Jr. ................ | 250/492.2 |
| 5,013,913 A | * | 5/1991 | Benner ..................... | 250/307 |
| 5,633,507 A | | 5/1997 | Pfeiffer et al. | |
| 5,767,521 A | * | 6/1998 | Takeno et al. ............ | 250/492.2 |
| 6,069,684 A | | 5/2000 | Golladay et al. | |
| 6,538,255 B1 | * | 3/2003 | Nakasuji ................. | 250/492.23 |
| 2001/0028037 A1 | | 10/2001 | Suzuki | |
| 2002/0043629 A1 | | 4/2002 | Benner | |
| 2003/0168616 A1 | | 9/2003 | Yabe et al. | |

FOREIGN PATENT DOCUMENTS

JP        2-232920 A        9/1990

* cited by examiner

*Primary Examiner*—Nikita Wells
*Assistant Examiner*—Andrew Smyth
(74) *Attorney, Agent, or Firm*—Sughrue Mion, PLLC

(57) ABSTRACT

A dual-mode electron beam column (10) for selectably providing, in an electron beam lithography machine, a Gaussian beam for enhanced writing resolution and a variable shaped beam for enhanced writing throughput comprises a first aperture (13) for confining the beam, a first lens (14) for focussing the beam at a first image plane positioned in dependence on the beam mode, a beamshaping second aperture (15) positionable in the beam path in the shaped beam mode, a second lens (16) effective in the shaped beam mode to focus the beam in a second image plane, and a third aperture (17) in the second image plane to confine or shape the beam depending on mode. Variation of the shape of the shaped beam is achieved by a beam double deflector system (18) operable only in the shaped beam mode.

18 Claims, 1 Drawing Sheet

DUAL-MODE ELECTRON BEAM COLUMN

Figures 1A, 1B:
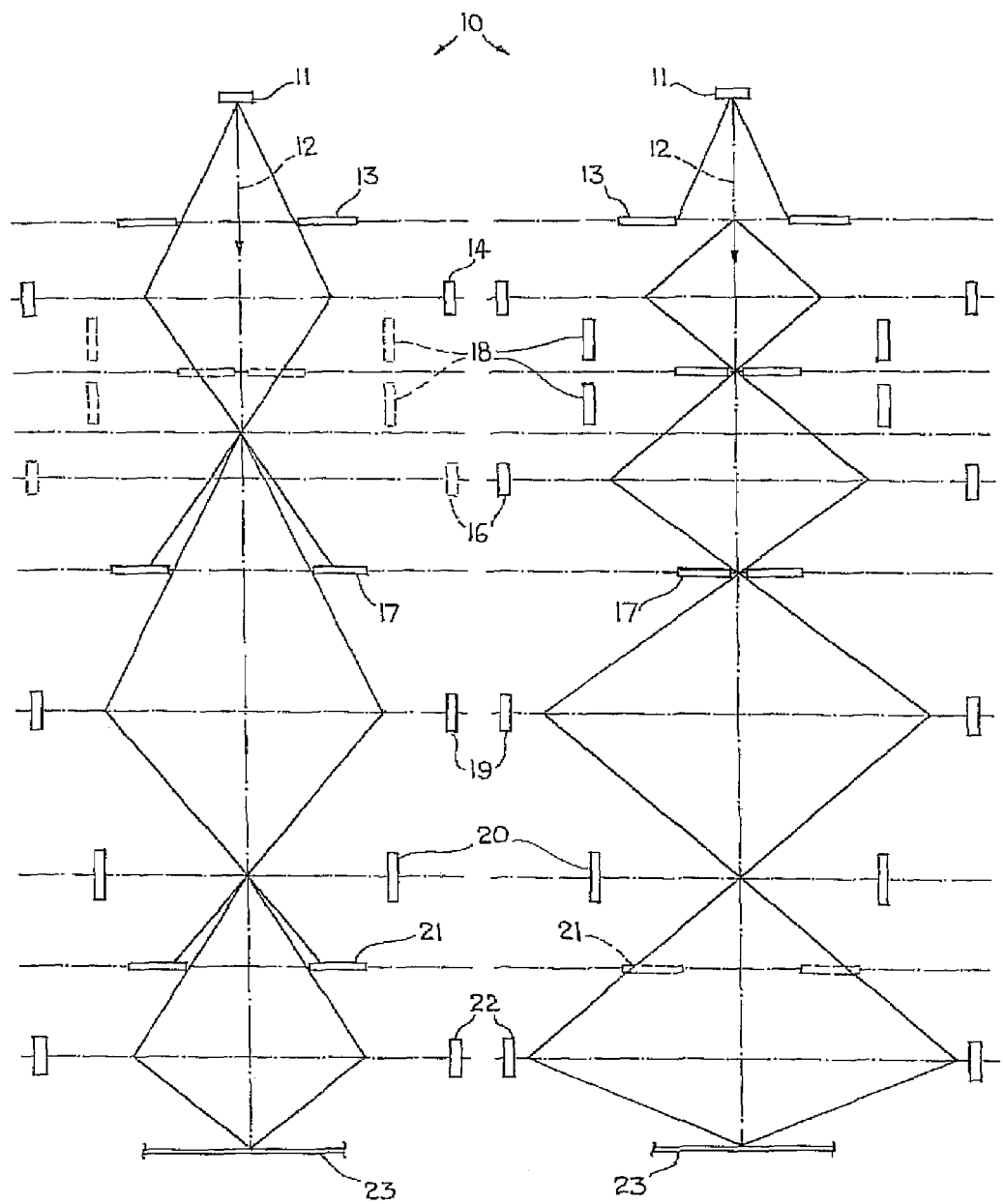

The present invention relates to a dual-mode electron beam column, particularly a column suitable for use in an electron beam lithography machine.

Electron beam lithography machines are primarily used for writing patterns, such as electrical circuits, on substrates. In such a process, a suitably prepared surface of a substrate supported on a movable stage is exposed to a focused electron beam, in particular a writing spot or probe of the beam, which is deflected in steps to trace a desired pattern on the surface and—in intervals between deflection steps—generates the pattern by, for example, dwelling on an electron-sensitive resist coating of the surface for a predetermined exposure time.

Patterns of this nature are commonly written with use of a Gaussian beam in which a finely focused beam spot acting on the substrate surface has a circular form. The fine spot provides a high level of resolution appropriate to writing fine pattern features, but has the penalty of reduced writing throughput due to the length of time required to scan the entire pattern. Throughput can be significantly increased, albeit at the expense of resolution, by use of a larger-area shaped spot which is normally square or oblong. The spot shape can be suitably varied for adaptation to the geometric forms characterising each pattern or individual regions of the same pattern. Larger areas can thus be exposed between each beam deflection step and writing of the entire pattern completed more quickly.

It is normal practice for a pattern-writing electron beam column to be dedicated to writing by a Gaussian beam or by a shaped beam. Consequently, two columns of different construction are required for the two pattern-writing modes, which represents a very substantial cost outlay and indeed in many circumstances is prohibitively expensive.

It is accordingly the principal object of the invention to provide a single electron beam column capable of operation in Gaussian beam mode and variable shaped beam mode according to operator choice.

Other objects and advantages of the invention will be apparent from the following description.

According to the present invention there is provided a dual-mode electron beam column for selectably providing a Gaussian beam and a variable shaped beam, comprising an electron source for generating an electron beam, a first aperture for confining the beam, a first lens for focusing the confined beam at a selectable one of two first image planes spaced-apart along the column and respectively for the Gaussian beam mode and the shaped beam mode, a second aperture selectably positionable in the beam path in the first image plane respective to the shaped beam mode for shaping the focused beam, a second lens effective in the shaped beam mode to focus the shaped beam at a second image plane, a selectable third aperture in the second image plane for further confining the confined beam in the Gaussian beam mode or for further shaping the shaped beam in the shaped beam mode and beam redirection means operable in the shaped beam mode to so redirect the beam relative to the second and third apertures as to define a variable shape thereof.

The third aperture can selectably be a round aperture for the Gaussian beam mode and a square aperture for the shaped beam mode, in which case the round aperture and the square aperture can be provided in respective aperture members alternatively insertable into the column to dispose the associated aperture in the beam path or the two apertures can be provided in a common aperture member, such as a slide, movable to position a selected one of the apertures in that path. In the latter embodiment, in particular, changing the aperture as part of the conversion of the column configuration from one mode to the other can be performed quickly and simply.

Similarly, the second aperture can be provided in a respective member removable from and reinsertable into the column or slidable between operative and inoperative settings depending on the respectively desired beam mode.

The second lens is preferably a power-controllable lens, for example an electromagnetic lens, and is controlled by reduction in power to be ineffective in the Gaussian beam mode. In similar manner, the beam redirection means can be a power-controllable double deflector and controlled by reduction in power to be ineffective in the Gaussian beam mode. For preference, the beam redirection means is arranged to so redirect the beam that the resultant shape of the beam is formed by a zone of overlap of the shapes of the second and third apertures. The zone of overlap can be selected to be square or oblong and, in the latter case, in one of two mutually orthogonal orientations. The size of the resultant shape can be varied by the same measure.

The column can additionally include a third lens for focussing the beam at a third image plane in both modes, a fourth aperture selectably positionable in the beam path in the Gaussian beam mode for confining the beam after focussing at the third image plane and/or a fourth lens for focussing the beam on a surface, which is to be exposed to the beam, in both modes. Moreover, beam deflecting means can be incorporated in the column for deflecting the beam in both modes for scanning the surface to be exposed to the beam. In that case, if the surface to be scanned is divided into a plurality of main fields and each main field is divided into a plurality of subfields, the deflecting means can comprise a respective deflector for deflecting the beam between main fields and a respective deflector for deflecting the beam between subfields. Each such deflector can be a double deflector for deflecting the beam twice. Finally, the column can also include beam blanking means for selectably blanking the beam.

An embodiment of the present invention will now be more particularly described by way of example with reference to the accompanying drawings, in which:

FIG. 1A is a schematic elevation of an electron beam column embodying the invention, in a first one of two selectable configurations; and FIG. 1B is a corresponding view of the column in the other one of the configurations.

Referring now to the drawings there are shown the principal components of an electron beam column 10 for, in particular, an electron beam lithography machine, in which FIG. 1A shows the column in a Gaussian beam mode and FIG. 1B the column in a variable shaped beam mode. A column of that kind incorporated in an lithography machine serves to generate an electron beam propagated along an axis to impinge, as a focused spot, on a substrate on which a pattern, for example an integrated circuit layout, is to be written. The pattern is usually written by deflecting the beam in steps so that the writing spot scans the surface in accordance with pattern lines and other shapes, which are to be recorded on the surface by interaction of the beam with an electron-sensitive coating. Scanning procedure normally entails prior fracturing of the pattern into main fields and further fracturing of the main fields into subfields and scanning the substrate surface by the beam in such a manner that the pattern features of the subfields of a main field are progressively recorded on the surface and the process then repeated for the main fields in succession. In the case of mass production the pattern is written on individual substrates loaded one after the other onto a movable stage located in a vacuum environment of the column. Electron beam lithography and the various steps involved in writing patterns are well known.

The column 10 schematically depicted in the drawings has a dual-mode capability allowing pattern writing selectably by a Gaussian beam providing, as already mentioned, fine resolution at the expense of throughput rate and by a variable shaped beam providing increased throughput with some compromise in quality of resolution. These two modes are achieved by change in the column configuration between that shown in FIG. 1A and that shown in FIG. 1B by insertion and removal of specific components and control of other components to be effective or ineffective. Distinction between inserted and removed component states and between effective and ineffective component states is apparent from the alternative illustration of components in solid lines and dashed lines in FIGS. 1A and 1B. For the sake of simplicity, initially the totality of all components of the column as required for both configurations will be described, followed by description of operation of the column in each mode and identification of the components actually required for each mode.

The column 10 has, at an upper end, an electron gun 11 which emits an electron beam propagated along a longitudinal axis 12 of the column. Arranged immediately downstream of the gun 11 is a first aperture 13, which has a circular opening, for confining the scatter of electrons of the beam so as to restrict the emitted beam to a required maximum power level. The first aperture can, if desired, have a variable size opening, which can be achieved by, for example, interchangeability with different apertures having different-size openings, by a diaphragm form of aperture opening definition or by another suitable method.

The first aperture 13 is followed in the direction of beam propagation by a first electromagnetic lens 14 for focussing the beam at first image plane, the lens 14 being controllable in power to vary the position of this plane along the length of the axis 12 in dependence on the selected beam mode as described further below. Downstream of the lens 14 is a removable second aperture 15 with a square aperture opening of several microns width for defining the shape of the beam in the shaped beam mode. The second aperture 15, which is not required in the Gaussian beam mode, can conveniently take the form of a slidable blade for selectably positioning the aperture opening in the beam path, i.e. on the beam axis 12. The aperture 15 lies in the first image plane determined by the first lens 14 in the case of the shaped beam mode.

A second electromagnetic lens 16 is located downstream of the second aperture element 15 and is effective in the shaped beam mode to focus the shaped beam at a second image plane. The lens 16 is a fixed component of the column, but can be reduced in power to be ineffective in the Gaussian beam mode. Disposed in the second image plane is a third aperture 17 selectably having a round opening for confining the beam in the Gaussian beam mode and a square opening for shaping the beam in the shaped beam mode. The third aperture 17 can take the form of an exchangeable element provided with a respective one of the openings or, more conveniently, a slidable element provided with both openings and movable to position the desired one of the openings in the beam path.

Disposed between the first and the second lens 14 and 16, more specifically on either side of the second aperture 15-] or at least the position this aperture occupies when present is a double deflector system 18 which is operable in the shaped beam mode of the column to initially deflect the shaped beam from and subsequently back to the axis 12 with the consequence of superimposition of part of the square form defined by the opening of the second aperture 15 on part of the square form similarly defined by the opening of the third aperture 17. The superimposed parts define the final shape of the beam. Depending on the directions and amounts of deflection the final shape will be a square with a desired width or an oblong with a desired width and length and a desired longitudinal orientation in one of two mutually perpendicular directions.

The third aperture element 17 is followed in the direction of beam propagation by a third electromagnetic lens 19 for focussing the beam in a further image plane and then by a beam blanking device 20 for blanking the beam during deflection by a conventional further double deflector system (not shown) for scanning purposes. The blanking device 20 is in turn followed by a removable fourth aperture 21 which has a round opening and is used in the Gaussian beam mode for confining the beam to maintain strength. As in the case of the removable second aperture 15 the fourth aperture 21 can have the form of a slidable blade for selectably positioning its opening in the beam path.

Finally, the beam passes through a fourth electromagnetic lens 23 which focuses the beam at a final image plane coincident with a resist-coated top surface of a substrate 23.

In the column configuration for pattern writing by the beam in Gaussian mode as shown in FIG. 1A the second aperture 15 is removed so that its aperture opening no longer lies in the beam path and the second lens 16 and deflector system 18 are controlled by reduction in operating power so as to be ineffective. The selectable third aperture 17 is positioned with its round aperture opening in the beam path and the fourth aperture element 21 is inserted into the column. The first lens 14 is controlled to focus the beam, after confining by the first aperture 13, at the first image plane which in this instance lies below the position of the second aperture 15 when present. The beam is focussed along the axis 12 as shown in FIG. 1A, culminating in a fine writing spot on the surface of the substrate 23. Writing is carried out, as evident from the preceding description, by deflection of the beam in steps by the further deflector system to trace the pattern on the substrate surface and blanking the beam during deflection. Due to the fine writing spot fine pattern features can be written with a high level of edge definition, but at a reduced throughput rate, i.e. extended time to write each pattern entirely.

In the column configuration for pattern writing in the variable shaped beam mode, as shown in FIG. 1B the second aperture element 15 with a square opening is inserted, the selectable third aperture element 17 is positioned with its square opening in the beam path and the fourth aperture element 21 is removed. The second lens 16 and the deflector system 18 are controlled to be effective. The first lens 14 is increased in power by a step in current to provide a shorter focal length and thereby focus the emitted beam at the alternatively positioned first image plane containing the second aperture element 15. Similarly, the second lens 16 is operated to focus the beam at the second image plane containing the third aperture element 17. As already mentioned, the double deflector system 18 is now effective to doubly deflect the beam in desired manner and produce selectable overlap of parts of the two square aperture openings thereby to form an intended shape and orientation of the beam writing spot. Writing with the shaped beam spot is carried out in the same manner as with the Gaussian beam spot. In this case, larger pattern areas can be exposed to the beam electrons between each deflection step so that the pattern can be written more quickly, but with some reduction in resolution.

Alteration of the column configuration is relatively simple and can be undertaken relatively rapidly. The possibility is opened up of converting the configuration in the interval between the writing of different patterns or in the course of writing a single pattern, such as by writing all finer pattern features in the Gaussian beam mode and then, following conversion, writing all the larger-area pattern features in the shaped beam mode. The result may be an improved throughput rate without, overall, any reduction in resolution.

The column of the preferred embodiment can be modified with respect to kind and disposition of components without departing from the described capability of conversion between the two beam modes, for example the lens can be electrostatic rather than electromagnetic.

The invention claimed is:

1. A dual-mode electron beam column for selectably providing a Gaussian beam and a variable shaped beam, comprising an electron source for generating an electron beam, a first aperture for confining the beam, a first lens for focusing the confined beam at a selectable one of two first image planes spaced-apart along the column and respectively for the Gaussian beam mode and the shaped beam mode, a second aperture selectably positionable in the beam path in the first image plane respective to the shaped beam mode for shaping the focused beam, a second lens effective in the shaped beam mode to focus the shaped beam at a second image plane, a selectable third aperture in the second image plane for further confining the confined beam in the Gaussian beam mode or for further shaping the shaped beam in the shaped beam mode and beam redirection means operable in the shaped beam mode to so redirect the beam relative to the second and third apertures as to define a variable shape thereof.

2. A column as claimed in claim 1, wherein the third aperture is selectably a round aperture for the Gaussian beam mode and a square aperture for the shaped beam mode.

3. A column as claimed in claim 2, wherein the round aperture and square aperture are provided in respective aperture members alternatively insertable into the column to dispose the associated aperture in the beam path.

4. A column as claimed in claim 2, wherein the round aperture and square aperture are provided in a common aperture member movable to position a selected one of the apertures in the beam path.

5. A column as claimed in claim 4, wherein the common aperture member is a slide.

6. A column as claimed in claim 1, wherein the second aperture is provided in a respective member removable from and reinsertable into the column.

7. A column as claimed in claim 1, wherein the second aperture is provided in a respective member slidable between operative and inoperative settings.

8. A column as claimed in claim 1, wherein the second lens is a power-controllable lens and is controlled by reduction in power to be ineffective in the Gaussian beam mode.

9. A column as claimed in claim 8, wherein the second lens is an electromagnetic lens.

10. A column as claimed in claim 1, wherein the beam redirection means is a power-controllable double deflector and is controlled by reduction in power to be ineffective in the Gaussian beam mode.

11. A column as claimed in claim 1 wherein the beam redirection means is arranged to so redirect the beam that the resultant shape of the beam is formed by a zone of overlap of the shapes of the second and third apertures.

12. A column as claimed in claim 1, comprising a third lens for focusing the beam at a third image plane in both modes.

13. A column as claimed in claim 12, comprising a fourth aperture selectably positionable in the beam path in the Gaussian beam mode for confining the beam after focussing at the third image plane.

14. A column as claimed in claim 1, comprising a fourth lens for focussing the beam on a surface, which is to be exposed to the beam, in both modes.

15. A column as claimed in claim 1, comprising beam deflecting means for deflecting the beam in both modes for scanning a surface to be exposed to the beam.

16. A column as claimed in claim 15, wherein the surface is divided into a plurality of main fields and each main field is divided into a plurality of subfields and the deflecting means comprises a respective deflector for deflecting the beam between main fields and a respective deflector for deflecting the beam between subfields.

17. A column as claimed in claim 16, wherein each deflector is a double deflector for deflecting the beam twice.

18. A column as claimed in claim 1, comprising beam blanking means for selectably blanking the beam.

* * * * *